(12) United States Patent
Ishikawa et al.

(10) Patent No.: US 10,575,420 B2
(45) Date of Patent: Feb. 25, 2020

(54) DISPLAY DEVICE

(71) Applicant: Japan Display Inc., Tokyo (JP)

(72) Inventors: Makoto Ishikawa, Tokyo (JP);
Manabu Mizuno, Tokyo (JP);
Shinichiro Tanaka, Tokyo (JP)

(73) Assignee: Japan Display Inc., Tokyo (JP)

( * ) Notice: Subject to any disclaimer, the term of this patent is extended or adjusted under 35 U.S.C. 154(b) by 1 day.

(21) Appl. No.: 15/919,891

(22) Filed: Mar. 13, 2018

(65) Prior Publication Data

US 2018/0270975 A1 Sep. 20, 2018

(30) Foreign Application Priority Data

Mar. 17, 2017 (JP) .................................. 2017-053518

(51) Int. Cl.
| | |
|---|---|
| *H05K 5/03* | (2006.01) |
| *G02F 1/1333* | (2006.01) |
| *H01L 51/00* | (2006.01) |
| *H01L 51/52* | (2006.01) |
| *H05K 5/00* | (2006.01) |
| *H01L 27/32* | (2006.01) |

(52) U.S. Cl.
CPC ......... *H05K 5/03* (2013.01); *G02F 1/133308* (2013.01); *H01L 51/0096* (2013.01); *H01L 51/5237* (2013.01); *H01L 51/5275* (2013.01); *H05K 5/0017* (2013.01); *G02F 2001/133331* (2013.01); *G02F 2201/56* (2013.01); *H01L 27/323* (2013.01); *Y02E 10/549* (2013.01); *Y10T 428/24628* (2015.01)

(58) Field of Classification Search
CPC .... H05K 5/03; H05K 5/0017; H01L 51/5275; H01L 51/0096; H01L 51/5237; H01L 27/323; G02F 1/133308; G02F 2201/56; G02F 2001/133331; Y02E 10/549; Y10T 428/24628
See application file for complete search history.

(56) References Cited

U.S. PATENT DOCUMENTS

| | | | |
|---|---|---|---|
| 2011/0281072 A1* | 11/2011 | Sabia .................... | C03B 23/023 428/156 |
| 2016/0326050 A1* | 11/2016 | Lee ........................ | C03C 21/002 |

FOREIGN PATENT DOCUMENTS

JP 2015-092422 A 5/2015

\* cited by examiner

*Primary Examiner* — David Sample
*Assistant Examiner* — Donald M Flores, Jr.
(74) *Attorney, Agent, or Firm* — K&L Gates LLP (57) ABSTRACT

According to an aspect, a display device includes: a cover member curved when viewed in a first axis direction along a first axis; and a display panel disposed on one side of the cover member. The cover member has a first surface facing the display panel and a second surface on the opposite side of the first surface. The first surface forms a straight line and at least a part of the second surface forms a curved line in a cross-section orthogonal to a second axis that is along a straight line extending from one end to the other end of the cover member when viewed in the first axis direction.

8 Claims, 11 Drawing Sheets

DISPLAY DEVICE

CROSS-REFERENCE TO RELATED APPLICATIONS

This application claims priority from Japanese Application No. 2017-053518, filed on Mar. 17, 2017, the contents of which are incorporated by reference herein in its entirety.

BACKGROUND

1. Technical Field

The present disclosure relates to a display device.

2. Description of the Related Art

A display device having a curved surface has been known. For example, Japanese Patent Application Laid-open Publication No. 2015-92422 discloses a technique employing a cover glass having a curved surface. In particular, an in-vehicle display device employing the cover glass having the curved surface is advantageous in that an automotive interior part with curved surfaces and the surface of the display device are smoothly connected together.

Recent years have seen demands for display devices to have more characteristic designs, in some cases. For example, a display surface may be desired to be curved about a first axis and also curved about a second axis orthogonal to the first axis. The display surface is, however, difficult to be curved about two orthogonal axes.

For the foregoing reasons, there is a need for a display device whose display surface appears to be curved about the two orthogonal axes.

SUMMARY

According to an aspect, a display device includes: a cover member curved when viewed in a first axis direction along a first axis; and a display panel disposed on one side of the cover member. The cover member has a first surface facing the display panel and a second surface on the opposite side of the first surface. The first surface forms a straight line and at least a part of the second surface forms a curved line in a cross-section orthogonal to a second axis that is along a straight line extending from one end to the other end of the cover member when viewed in the first axis direction.

DETAILED DESCRIPTION

Modes (embodiments) for carrying out the present disclosure will be described in detail with reference to the drawings. The present disclosure is not limited by the descriptions of the following embodiments. The elements described hereunder include those that can be easily thought of by those skilled in the art and substantially the same elements. The elements described hereunder may also be combined as appropriate. The disclosure is merely an example, and the present disclosure naturally encompasses appropriate modifications maintaining the gist of the disclosure that is easily conceivable by those skilled in the art. To further clarify the description, a width, a thickness, a shape, and the like of each component may be schematically illustrated in the drawings as compared with an actual aspect. However, this is merely an example and interpretation of the disclosure is not limited thereto. The same elements as those described in the drawings that have already been discussed are denoted by the same reference numerals throughout the description and the drawings, and detailed description thereof will not be repeated in some cases. In this disclosure, when an element A is described as being "on" another element B, the element A can be directly on the other element B, or there can be one or more elements between the element A and the other element B.

First Embodiment

Figure 1:
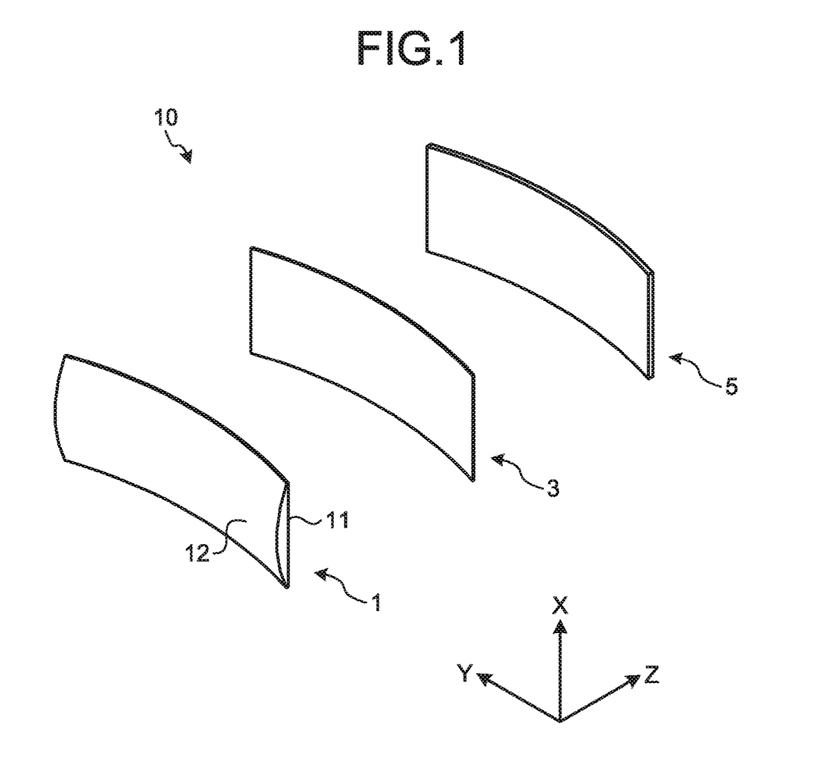
FIG. 1 is an exploded perspective view illustrating a display device according to a first embodiment of the present disclosure.
Figure 2:
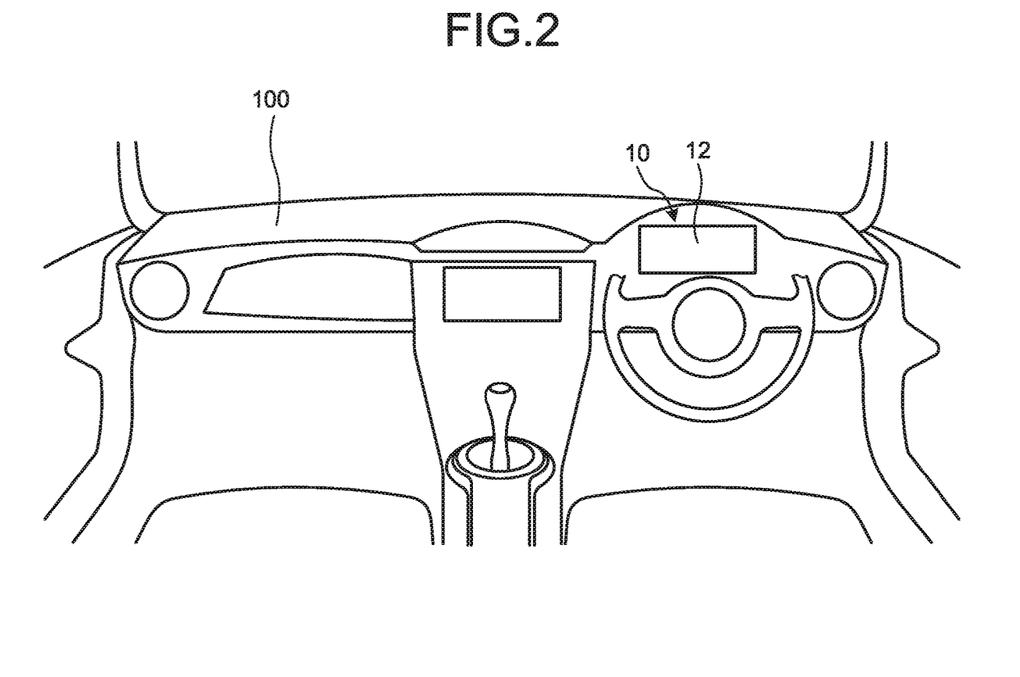
FIG. 2 is an internal view illustrating a vehicle on which the display device according to the first embodiment is mounted.

FIG. 1 is an exploded perspective view illustrating a display device according to a first embodiment of the present disclosure. FIG. 2 is an internal view illustrating a vehicle on which the display device according to the first embodiment is mounted. As illustrated in FIG. 1, a display device 10 according to the first embodiment includes a display panel 5, an adhesive member 3, and a cover member 1. The cover member 1 is mounted on the display panel 5 with the adhesive member 3 interposed therebetween. The display device 10 is mounted, for example, on a dashboard 100 of the vehicle, as illustrated in FIG. 2.

The display panel 5 is a liquid crystal panel, for example. A backlight is provided on the back side of the display panel 5. The display panel 5 includes a first substrate and a second substrate that are made of glass or the like, and a liquid crystal layer interposed between the first substrate and the second substrate. The display panel 5 displays, for example, a speedometer, a tachometer, a fuel gauge, and a water temperature gauge. The display panel 5 is rectangular, for example, when viewed from the front. The display panel 5 is curved about an axis parallel to short sides thereof, as illustrated in FIG. 1. That is, the display panel 5 is curved when viewed in the short side direction. Both ends in the long side direction of the display panel 5 are closer to the eye-point of a viewer than the center in the short side direction of the display panel 5.

In the following description, an XYZ orthogonal coordinate system is used. The X-axis is parallel to the short sides of the display panel 5. The Y-axis is parallel to a straight line extending from one end to the other end of the display panel 5 when viewed in the X-axis direction. The Z-axis is orthogonal to both the X-axis and the Y-axis. The direction along the X-axis is referred to as the X-direction; the direction along the Y-axis is referred to as the Y-direction; and the direction along the Z-axis is referred to as the Z-direction.

The adhesive member 3 bonds the cover member 1 to the display panel 5. The adhesive member 3 is a rectangular sheet, for example. The adhesive member 3 is interposed between the display panel 5 and the cover member 1. The adhesive member 3 is placed on top of the display panel 5. The adhesive member 3 includes an optical adhesive, for example. The adhesive member 3 transmits light emitted from the display panel 5 toward the cover member 1.

Figure 3:
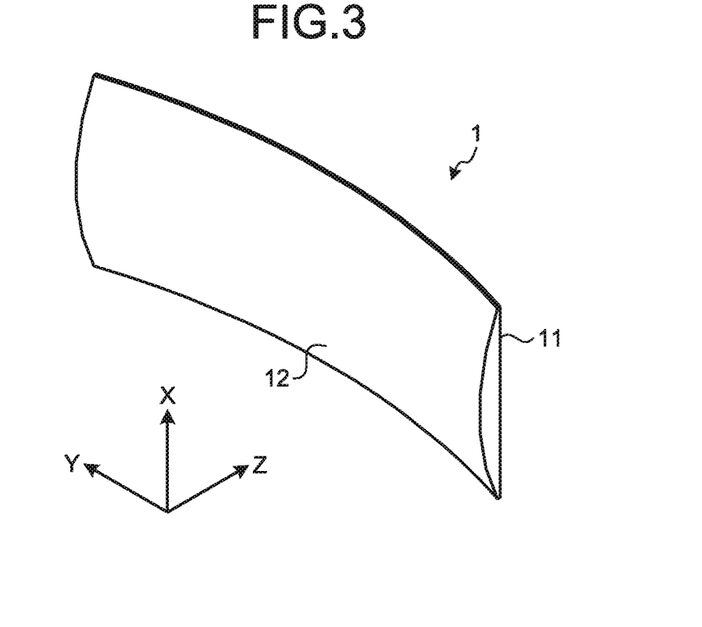
FIG. 3 is a perspective view illustrating a cover member according to the first embodiment.
Figure 4:
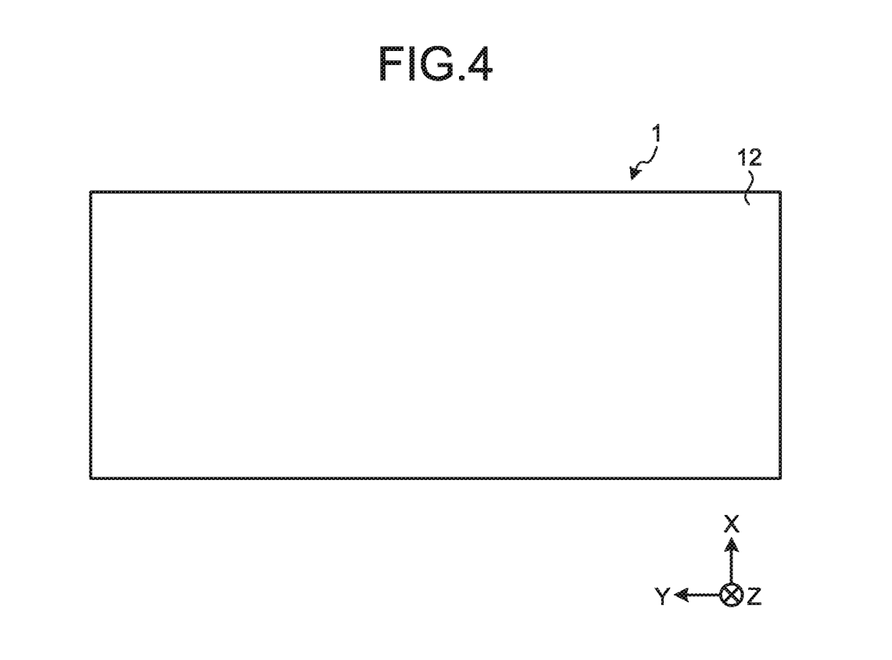
FIG. 4 is a front view illustrating the cover member according to the first embodiment.
Figure 5:
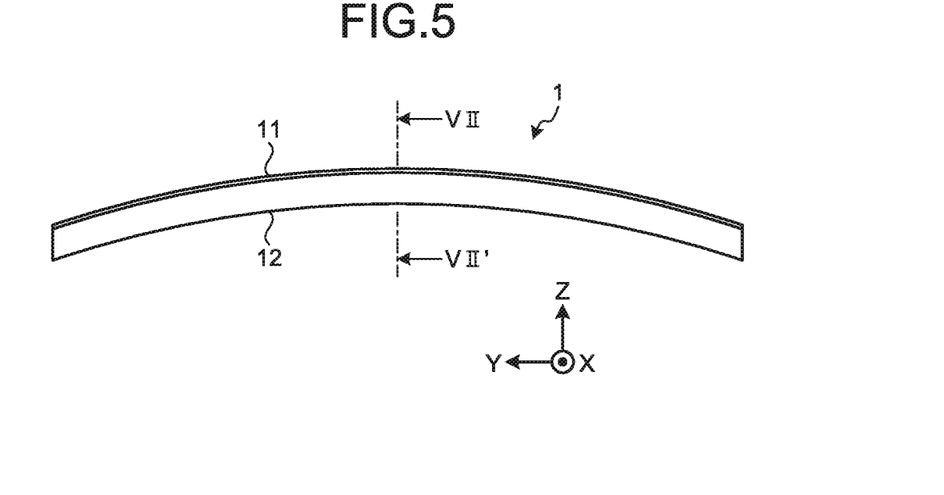
FIG. 5 is a plan view illustrating the cover member according to the first embodiment.
Figure 6:
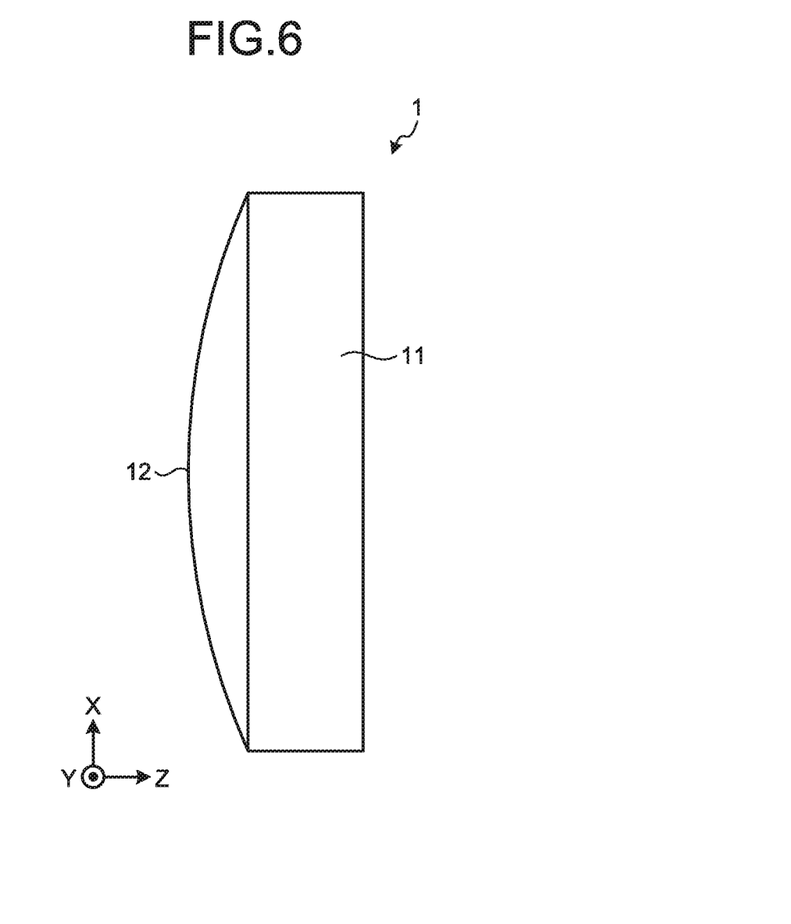
FIG. 6 is a right side view illustrating the cover member according to the first embodiment.
Figure 7:
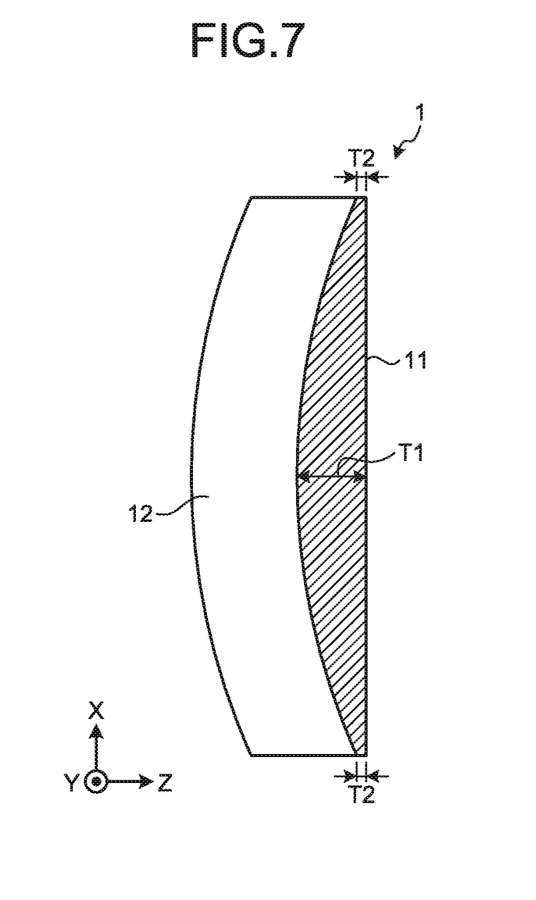
FIG. 7 is a cross-sectional view illustrating a cross-section taken along a line VII-VII' in FIG. 5.

FIG. 3 is a perspective view illustrating the cover member according to the first embodiment. FIG. 4 is a front view illustrating the cover member according to the first embodiment. FIG. 5 is a plan view illustrating the cover member according to the first embodiment. FIG. 6 is a right side view illustrating the cover member according to the first embodiment. FIG. 7 is a cross-sectional view illustrating a cross-section taken along a line VII-VII' in FIG. 5.

The cover member 1 protects the display panel 5. The cover member 1 is made of glass, for example. The cover member 1 is disposed on one side of the display panel 5, and mounted on the display panel 5 with the adhesive member 3 interposed therebetween. The cover member 1 is rectangular when viewed from the front, as illustrated in FIG. 4. The cover member 1 is curved about the X-axis. That is, the cover member 1 is curved when viewed in the X-direction, as illustrated in FIG. 5. The light emitted from the display panel 5 reaches the viewer after passing through the cover member 1. The viewer sees as if an image is displayed along a surface of the cover member 1.

As illustrated in FIG. 3, the cover member 1 has a first surface 11 and a second surface 12. The first surface 11 faces the display panel 5, and has a shape along the display panel 5. When viewed in the X-direction as illustrated in FIG. 5, the first surface 11 forms a circular arc centering on a point on the opposite side of the display panel 5 with respect to the cover member 1. The second surface 12 is a surface on the opposite side of the surface facing the display panel 5. That is, the second surface 12 is a back surface of the first surface 11. When viewed in the X-direction as illustrated in FIG. 5, the second surface 12 forms a circular arc centering on a point on the opposite side of the display panel 5 with respect to the cover member 1. As illustrated in FIG. 5, the circular arc formed by the second surface 12 has a curvature substantially equal to that of the circular arc formed by the first surface 11 when viewed in the X-direction.

The cross-sectional shape obtained by cutting the cover member 1 along a plane orthogonal to the Y-axis is constant at any positions in the Y-direction of the cover member 1. As illustrated in FIG. 7, the first surface 11 forms a straight line parallel to the X-axis in the cross-section orthogonal to the Y-axis. The second surface 12 forms a curved line in the cross-section illustrated in FIG. 7. Specifically, in the cross-section illustrated in FIG. 7, the second surface 12 forms a circular arc centering on a point on the display panel 5 side with respect to the cover member 1. That is, both ends in the X-direction of the second surface 12 are closer to the display panel 5 than the center in the X-direction of the second surface 12. A distance T1 from the first surface 11 to the second surface 12 at the center in the X-direction is larger than a distance T2 from the first surface 11 to the second surface 12 at the ends in the X-direction.

As described above, the cover member 1 is curved when viewed in the X-direction. The second surface 12 forms the curved line in the section illustrated in FIG. 7. In other words, the entire second surface 12 is curved about the curved line (curved line illustrated in FIG. 5) formed by the first surface 11 when viewed in the X-direction, the curved line serving as an axis of the curve of the second surface 12.

Figure 8:
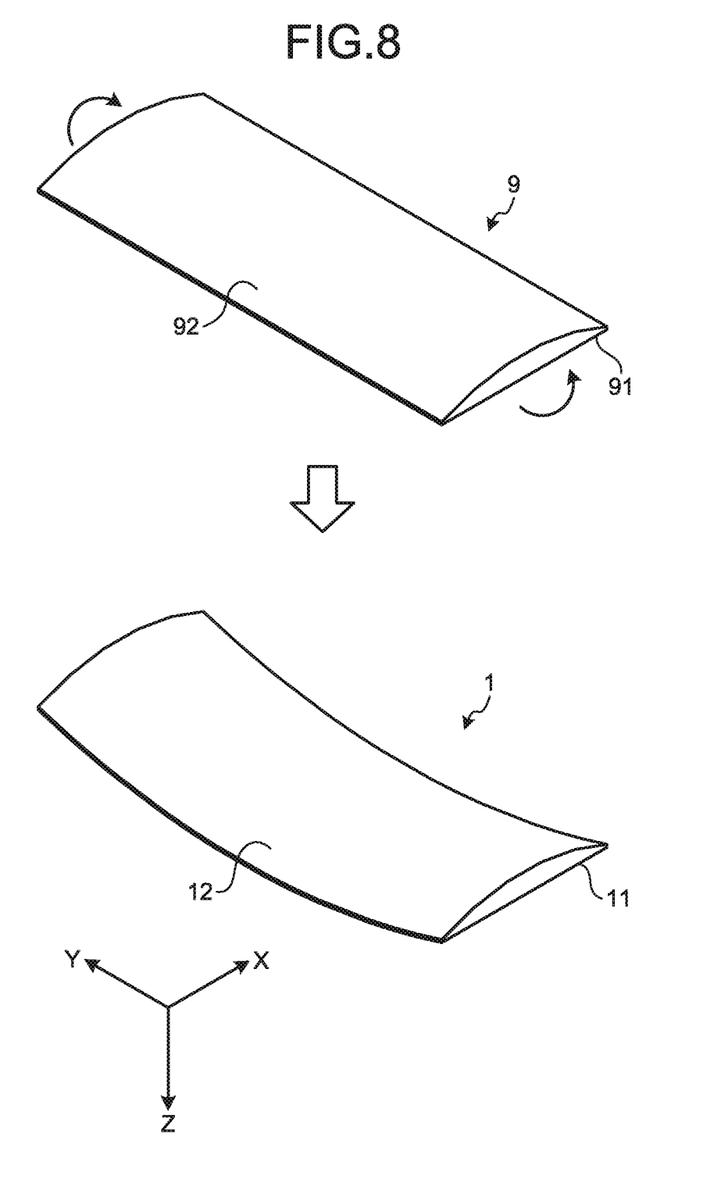
FIG. 8 is a schematic diagram for explaining a method for manufacturing the cover member according to the first embodiment.

FIG. 8 is a schematic diagram for explaining a method for manufacturing the cover member according to the first embodiment. As illustrated in FIG. 8, the cover member 1 is formed by bending an original plate 9 about the X-axis. The original plate 9 has a linear outline when viewed in the X-direction. The original plate 9 has a first surface 91 and a second surface 92. The first surface 91 is a flat surface. The second surface 92 is a curved surface curved about the Y-axis.

The display device 10 may not necessarily be mounted on the vehicle, but may be used in other electronic apparatuses, such as a portable electronic apparatus. When the display device 10 is mounted on the vehicle, images displayed by the display device 10 are not limited to the vehicle meters and gauges, but may be a map of a vehicle navigation system, for example.

The display panel 5 may be an organic electroluminescent (EL) panel. When the display panel 5 is the organic EL panel, no backlight is needed. The display panel 5 may have a touch detection function. That is, a touchscreen panel may be embedded in the display panel 5 or on a surface of the display panel 5.

The cover member 1 may not necessarily be made of glass. The cover member 1 may be made of a synthetic resin, for example. In the cross-section orthogonal to the Y-axis, the second surface 12 may not necessarily have a circular arc shape extending from one end to the other end in the X-direction thereof as illustrated in FIG. 7. In the cross-section orthogonal to the Y-axis, at least a part of the second surface 12 needs to form a curved line. For example, in the cross-section orthogonal to the Y-axis, the second surface 12 may be configured such that a part of the second surface 12 forms a curved line, and the other part of the second surface 12 forms a straight line. Alternatively, in the cross-section orthogonal to the Y-axis, the second surface 12 may be configured such that a part of the second surface 12 forms a curved line having a first curvature, and the other part of the second surface 12 forms a curved line having a second curvature different from the first curvature, for example.

As described above, the display device 10 includes: the cover member 1 curved when viewed in a direction (X-direction) along a first axis (X-axis); and the display panel 5 disposed on one side of the cover member 1. The cover member 1 has the first surface 11 facing the display panel 5 and the second surface 12 on the opposite side of the display panel 5. Assume that a second axis (Y-axis) is along a straight line extending from one end to the other end of the cover member 1 when viewed in the direction (X-direction) along the first axis (X-axis). In this case, in the cross-section orthogonal to the second axis (Y-axis), the first surface 11 forms a straight line, and at least a part of the second surface 12 forms a curved line.

This configuration allows the viewer to see as if the entire cover member 1 is curved about the second axis (Y-axis). As a result, the display panel 5 and the cover member 1 appear to be curved about the first axis (X-axis), and also curved about the second axis (Y-axis). Consequently, the display device 10 can make a display surface thereof appear to be curved about the two orthogonal axes.

The cross-sectional shape obtained by cutting the cover member 1 with a plane orthogonal to the second axis (Y-axis) is constant. This configuration suppresses distortion of an image displayed by the display device 10.

In the cross-section orthogonal to the second axis (Y-axis), both ends in the direction (X-direction) along the first axis (X-axis) of the second surface 12 are closer to the display panel 5 than the center in the direction (X-direction) along the first axis (X-axis) of the second surface 12. As a result, the display device 10 can make an image appear to project toward the viewer.

When viewed from the second surface 12, both ends thereof in the direction (Y-direction) along the second axis (Y-axis) are closer to the eye-point of an viewer than the center thereof in the direction (Y-direction) along the second axis (Y-axis). As a result, when the display device 10 is mounted on a vehicle interior part, the display device 10 is smoothly connected to the interior part.

Second Embodiment

Figure 9:
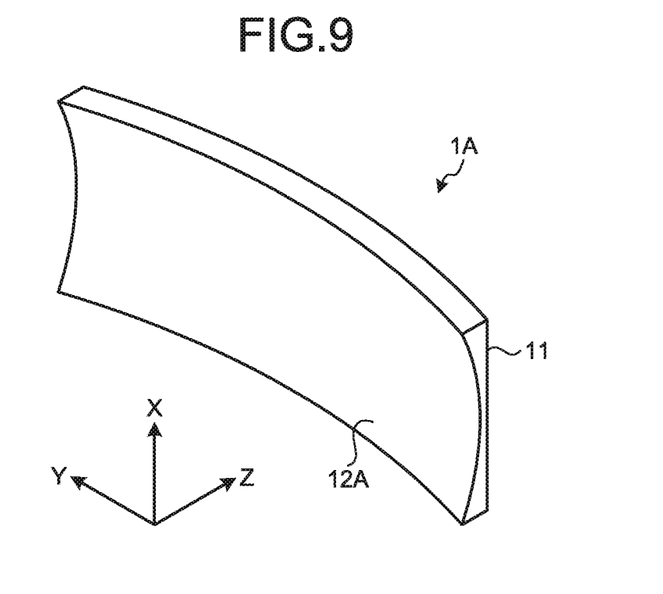
FIG. 9 is a perspective view illustrating a cover member according to a second embodiment of the present disclosure.
Figure 10:
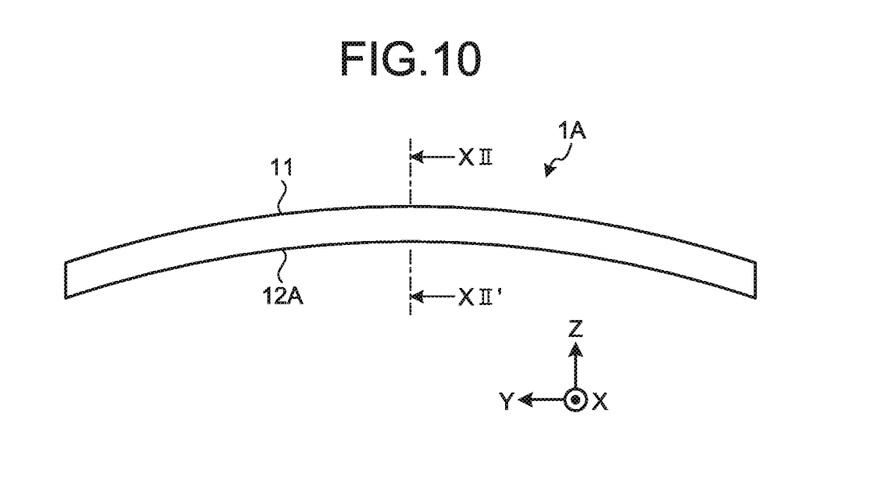
FIG. 10 is a plan view illustrating the cover member according to the second embodiment.
Figure 11:
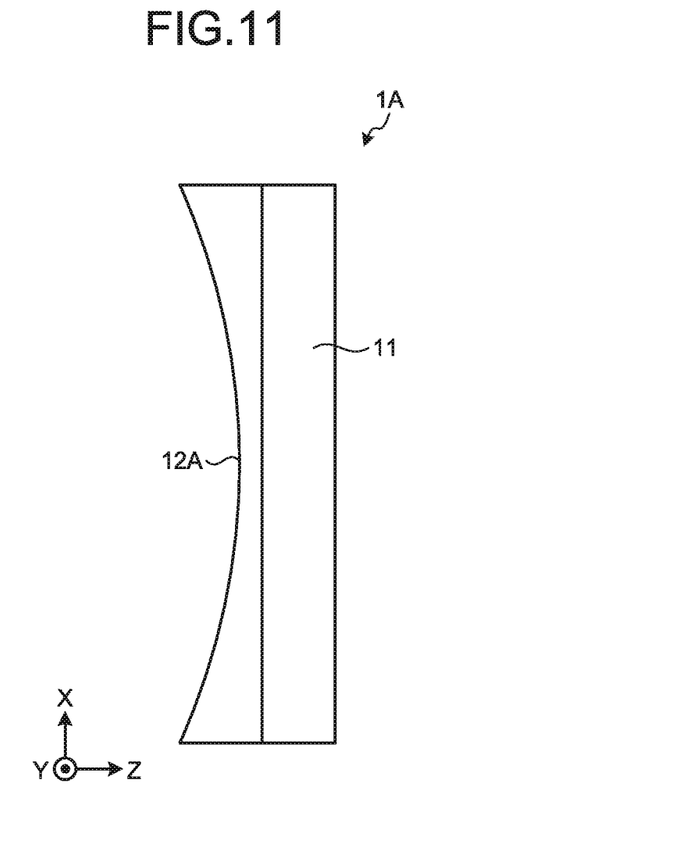
FIG. 11 is a right side view illustrating the cover member according to the second embodiment.
Figure 12:
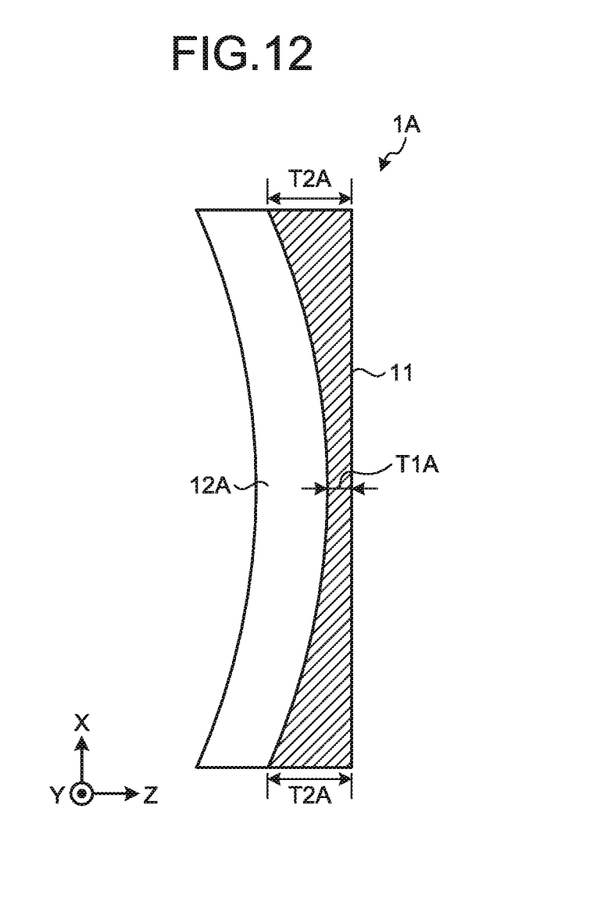
FIG. 12 is a cross-sectional view illustrating a cross-section taken along a line XII-XII' in FIG. 10.

FIG. 9 is a perspective view illustrating a cover member according to a second embodiment of the present disclosure. FIG. 10 is a plan view illustrating the cover member according to the second embodiment. FIG. 11 is a right side view illustrating the cover member according to the second embodiment. FIG. 12 is a cross-sectional view illustrating a cross-section taken along a line XII-XII' in FIG. 10.

A cover member 1A according to the second embodiment is curved about the X-axis, as illustrated in FIG. 9. That is, the cover member 1A is curved when viewed in the X-direction, as illustrated in FIG. 10. The cover member 1A has a second surface 12A. As illustrated in FIG. 10, the second surface 12A forms a circular arc centering on a point on the opposite side of the display panel 5 with respect to the cover member 1A when viewed in the X-direction. When viewed in the X-direction, the circular arc formed by the second surface 12A has a curvature substantially equal to that of the circular arc formed by the first surface 11.

The cross-sectional shape obtained by cutting the cover member 1A along a plane orthogonal to the Y-axis is constant at any positions in the Y-direction of the cover member 1A. The second surface 12A forms a curved line in the cross-section illustrated in FIG. 12. Specifically, in the cross-section illustrated in FIG. 12, the second surface 12A forms a circular arc centering on a point on the opposite side of the display panel 5 with respect to the cover member 1A. That is, the center in the X-direction of the second surface 12A is closer to the display panel 5 than both ends in the X-direction of the second surface 12A. A distance T1A from the first surface 11 to the second surface 12A at the center in the X-direction is smaller than a distance T2A from the first surface 11 to the second surface 12A at the ends in the X-direction.

As described above, the cover member 1A is curved when viewed in the X-direction, and the second surface 12A forms the curved line in the cross-section illustrated in FIG. 12. In other words, the entire second surface 12A is curved about the curved line (curved line illustrated in FIG. 10) formed by the first surface 11 when viewed in the X-direction, the curved line serving as an axis of the curve of the second surface 12A.

Third Embodiment

Figure 13:
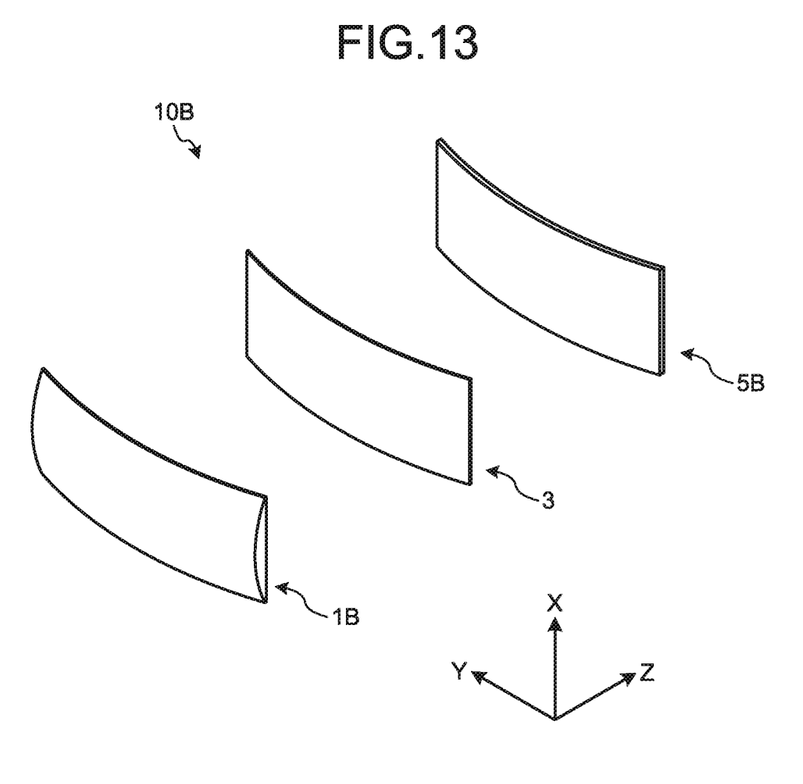
FIG. 13 is an exploded perspective view illustrating a display device according to a third embodiment of the present disclosure.
Figure 14:
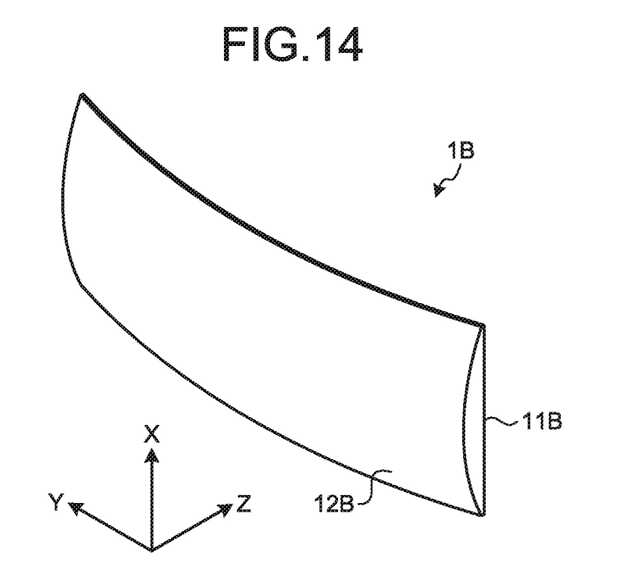
FIG. 14 is a perspective view illustrating a cover member according to the third embodiment.
Figure 15:
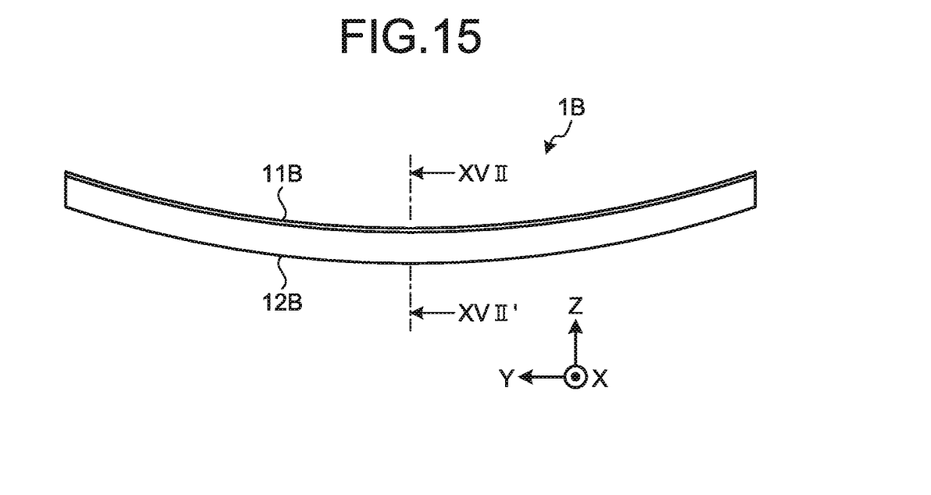
FIG. 15 is a plan view illustrating the cover member according to the third embodiment.
Figure 16:
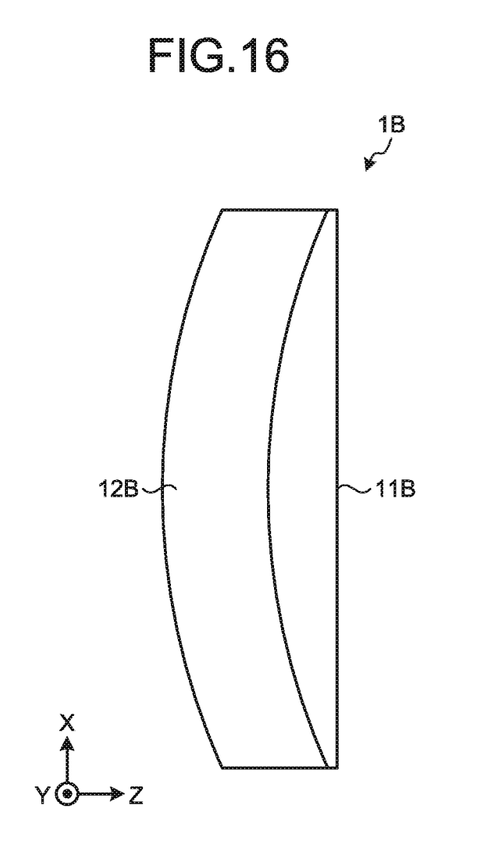
FIG. 16 is a right side view illustrating the cover member according to the third embodiment.
Figure 17:
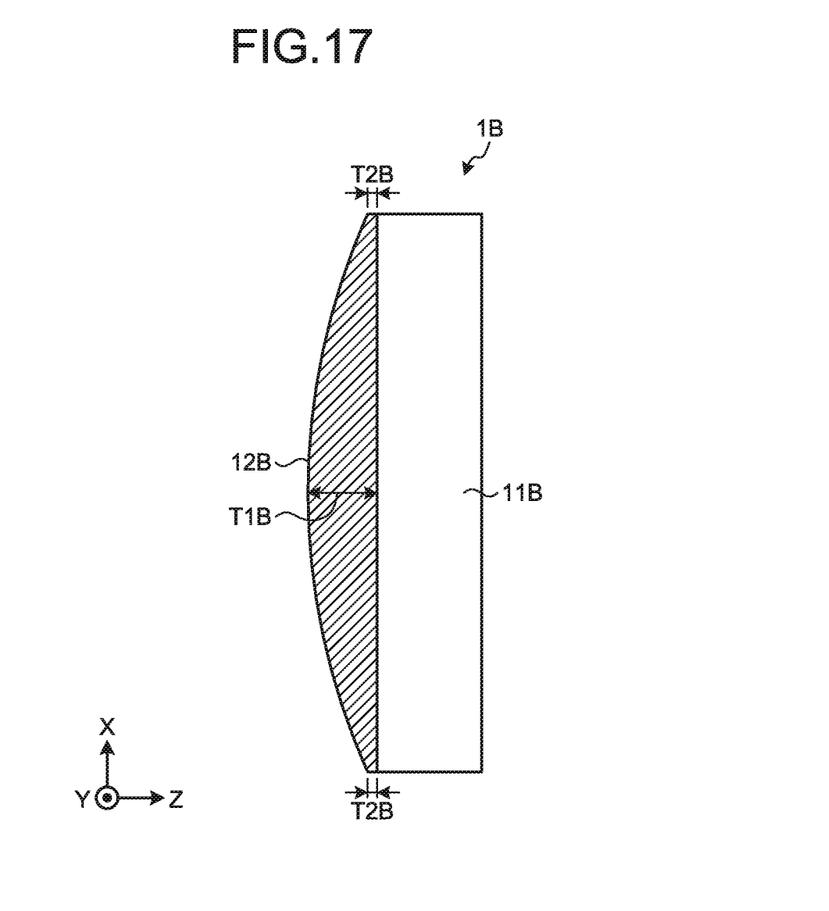
FIG. 17 is a cross-sectional view illustrating a cross-section taken along a line XVII-XVII' in FIG. 15.

FIG. 13 is an exploded perspective view illustrating a display device according to a third embodiment of the present disclosure. FIG. 14 is a perspective view illustrating a cover member according to the third embodiment. FIG. 15 is a plan view illustrating the cover member according to the third embodiment. FIG. 16 is a right side view illustrating the cover member according to the third embodiment. FIG. 17 is a cross-sectional view illustrating a cross-section taken along a line XVII-XVII' in FIG. 15.

A display device 10B according to the third embodiment includes a display panel 5B and a cover member 1B. The display panel 5B is curved about the X-axis, as illustrated in FIG. 13. That is, the display panel 5B is curved when viewed in the X-direction. When viewed from the viewer, the center in the long side direction of the display panel 5B is closer to the eye-point of the viewer than ends in the long side direction of the display panel 5B.

The cover member 1B is curved about the X-axis, as illustrated in FIG. 14. That is, the cover member 1B is curved when viewed in the X-direction, as illustrated in FIG. 15. The cover member 1B has a first surface 11B and a second surface 12B. The first surface 11B faces the display panel 5B, and has a shape along the display panel 5B. As illustrated in FIG. 15, each of the first surface 11B and the second surface 12B forms a circular arc centering on a point on the display panel 5B side with respect to the cover member 1B when viewed in the X-direction. When viewed in the X-direction, the circular arc formed by the second surface 12B has a curvature substantially equal to that of the circular arc formed by the first surface 11B.

The cross-sectional shape obtained by cutting the cover member 1B along a plane orthogonal to the Y-axis is constant at any positions in the Y-direction of the cover member 1B. As illustrated in FIG. 17, the first surface 11B forms a straight line parallel to the X-axis in the cross-section orthogonal to the Y-axis. The second surface 12B forms a curved line in the cross-section illustrated in FIG. 17. Specifically, the second surface 12B forms a circular arc centering on a point on the display panel 5B side with respect to the cover member 1B in the cross-section illustrated in FIG. 17. That is, the center in the X-direction of the second surface 12B is closer to the eye-point of the viewer than the ends in the X-direction of the second surface 12B. A distance T1B from the first surface 11B to the second surface 12B at the center in the X-direction is larger than a distance T2B from the first surface 11B to the second surface 12B at the ends in the X-direction.

As described above, the cover member 1B is curved when viewed in the X-direction, and the second surface 12B forms the curved line in the cross-section illustrated in FIG. 17. In other words, the overall second surface 12B is curved about the curved line (curved line illustrated in FIG. 15) formed by the first surface 11B when viewed in the X-direction, the curved line serving as an axis of the curve of the second surface 12B.

The present disclosure can naturally provide other advantageous effects that are provided by the aspects described in the embodiments above and are clearly defined by the description in the present specification or appropriately conceivable by those skilled in the art.

What is claimed is:

1. A display device comprising:
   a cover member curved when viewed in a first axis direction along a first axis; and
   a display panel disposed on one side of the cover member, wherein
   the cover member has a first surface facing the display panel and a second surface on the opposite side of the first surface,
   the first surface forms a straight line and at least a part of the second surface forms a curved line in a cross-section orthogonal to a second axis that is along a straight line extending from one end to the other end of the cover member when viewed in the first axis direction, and
   the second surface forms a circular arc over an entire length of the second surface when viewed in the first axis direction.

2. The display device according to claim 1, wherein a cross-sectional shape obtained by cutting the cover member along a plane orthogonal to the second axis is constant at any positions in a second axis direction along the second axis.

3. The display device according to claim 2, wherein, when viewed in the cross-section orthogonal to the second axis, both ends of the second surface in the first axis direction are closer to the display panel than a center of the second surface in the first axis direction.

4. The display device according to claim 3, wherein, when viewed from the second surface, both ends of the second surface in the second axis direction are closer to an eye-point of a viewer than a center of the second surface in the second axis direction.

5. The display device according to claim 2, wherein, when viewed from the second surface, both ends of the second surface in the second axis direction are closer to an eye-point of a viewer than a center of the second surface in the second axis direction.

6. The display device according to claim 1, wherein, in the cross-section orthogonal to the second axis, both ends of the second surface in the first axis direction are closer to the display panel than a center of the second surface in the first axis direction.

7. The display device according to claim 6, wherein, when viewed from the second surface, both ends of the second surface in a second axis direction along the second axis are closer to an eye-point of a viewer than a center of the second surface in the second axis direction.

8. The display device according to claim 1, wherein, when viewed from the second surface, both ends of the second surface in a second axis direction along the second axis are closer to an eye-point of an viewer than a center of the second surface in the second axis direction.

* * * * *